Jan. 6, 1970 E. I. SCHWARTZ 3,488,605

OSCILLATOR WITH DIGITAL COUNTER FREQUENCY CONTROL CIRCUITS

Filed May 15, 1968 2 Sheets-Sheet 1

INVENTOR
EDMUND I. SCHWARTZ

INVENTOR
EDMUND I. SCHWARTZ

United States Patent Office 3,488,605
Patented Jan. 6, 1970

3,488,605

OSCILLATOR WITH DIGITAL COUNTER FREQUENCY CONTROL CIRCUITS

Edmund I. Schwartz, Fairlawn, N.J., assignor to Threshold Electronic Research, a division of Slant/Fin Corporation, a New York corporation Filed May 15, 1968, Ser. No. 729,163
Int. Cl. H03b 3/04
U.S. Cl. 331—17 15 Claims

ABSTRACT OF THE DISCLOSURE

A counter chain translates the frequency of an oscillator into a series of integers representing a numerical indication of the oscillator frequency. One or more stages of the counter chain representing one or more integers of the oscillator frequency is used to control the reactance of a variable reactance device coupled to a frequency determining network included in the oscillator. One of more states associated with a plurality of states capable of being generated by a counter is isolated. All states above the isolated state cause the oscillator frequency to increase in accordance with a signal developed by the system to control the reactance of the variable device as a function of the state of the selected counter stage. The isolated state does not control or contribute to the generation of the control signal and hence does not vary the reactance of the frequency determining device. In this manner the oscillator, controlled as above, assumes at that integer determined by the selected counter stage, a frequency of a numerical designation corresponding to the isolated state.

BACKGROUND OF INVENTION

This invention relates to frequency controllable sources and more particularly to an improved system for using digital techniques in a controlled frequency source.

Basically the term frequency control or automatic frequency control, abbreviated AFC, denotes an arrangement for automatically keeping the frequency of a receiver, or other oscillator, at a predetermined value, necessary, for example, to produce the desired intermediate frequency (I.F.), as in frequency modulation receivers, television receivers and so on.

Uncontrolled oscillator circuits have a normal tendency to drift with temperature, supply potential changes and so on, and hence control techniques are desirable. In this manner the prior art is laden with techniques and apparatus pertinent and operative to maintain the frequency of oscillations from such a circuit within, or at a desired or prescribed range of frequencies. Such approaches may detect a deviation of the average value of a related frequency in the system, as the I.F., from a center frequency by means of a phase discriminator, as a Foster-Seely type, ratio detector and so on, which develops a D.C. potential having a polarity determined by the sense of the deviation. This potential is then used to control a variable reactance device in such a manner as to cause the oscillator to change its frequency in a direction to cancel or correct for the error.

Coupled closely with the broad art of frequency control is an alternative approach known as frequency synthesis. In these techniques use is made of a stable source of oscillation, sometimes referred to, in the system, as a primary source, as a crystal controlled oscillator, atomic clock and so on; whereby the inherent stability of the primary source is more than sufficient for the proposed application. These systems utilize frequency mixing, multiplication, division and other related techniques to provide a plurality of selected output frequencies, each of which possesses the inherent stability associated with the primary source.

In such systems digital, as well as analog, circuit and design techniques are employed. With the advent and widespread use of transistors and integrated circuits, some of the digital approaches, formerly considered too expensive are being utilized.

Each of the analog or digital approaches, of course, has inherent advantages and disadvantages, which are too numerous to indicate herein due to the extensive number of the different techniques and apparatus.

It is an object of the present invention to provide an improved technique of oscillator frequency control using a digital approach.

SUMMARY OF THE INVENTION

According to an embodiment of the present invention, a tuneable oscillator has the output frequency thereof, applied to a counting circuit. The counting circuit functions to translate the output frequency into a convenient format capable of being utilized, if desired, with a display. In this manner a chain of decade counters translates the frequency into a decimal number having a given number of integers corresponding to the actual frequency of oscillations. One or more stages of these decade counters is used to provide a control signal for a variable reactance device coupled to the frequency determining network of the oscillator. The control signal functions to change the reactance of the variable device according to the numerical indication obtained from the selected decade stage, which for example, may represent one of ten states available at that integer. A selected or predetermined one of these ten states does not serve to control the reactance of the device, but is essentially isolated therefrom. All states above this isolated state serve to lower the frequency of the oscillator via control of the reactance, while all states below serve to raise the frequency of the oscillator.

Hence the oscillator is forced to assume a frequency corresponding to the isolated state at that integer determined by the position of said counter in the chain.

Additional objects and advantages of the present invention will be apparent upon consideration of the following specification when taken in conjunction with the accompanying drawings listed in the:

BRIEF DESCRIPTION OF THE DRAWINGS

Referring to FIGURE 1 there is shown a variable frequency oscillator 10. Oscillator 10 may be of a conventional design, such as a Hartley or Colpitts configuration and as such is capable of being tuned over a relatively large frequency band.

Figures 1, 3A, 3B:
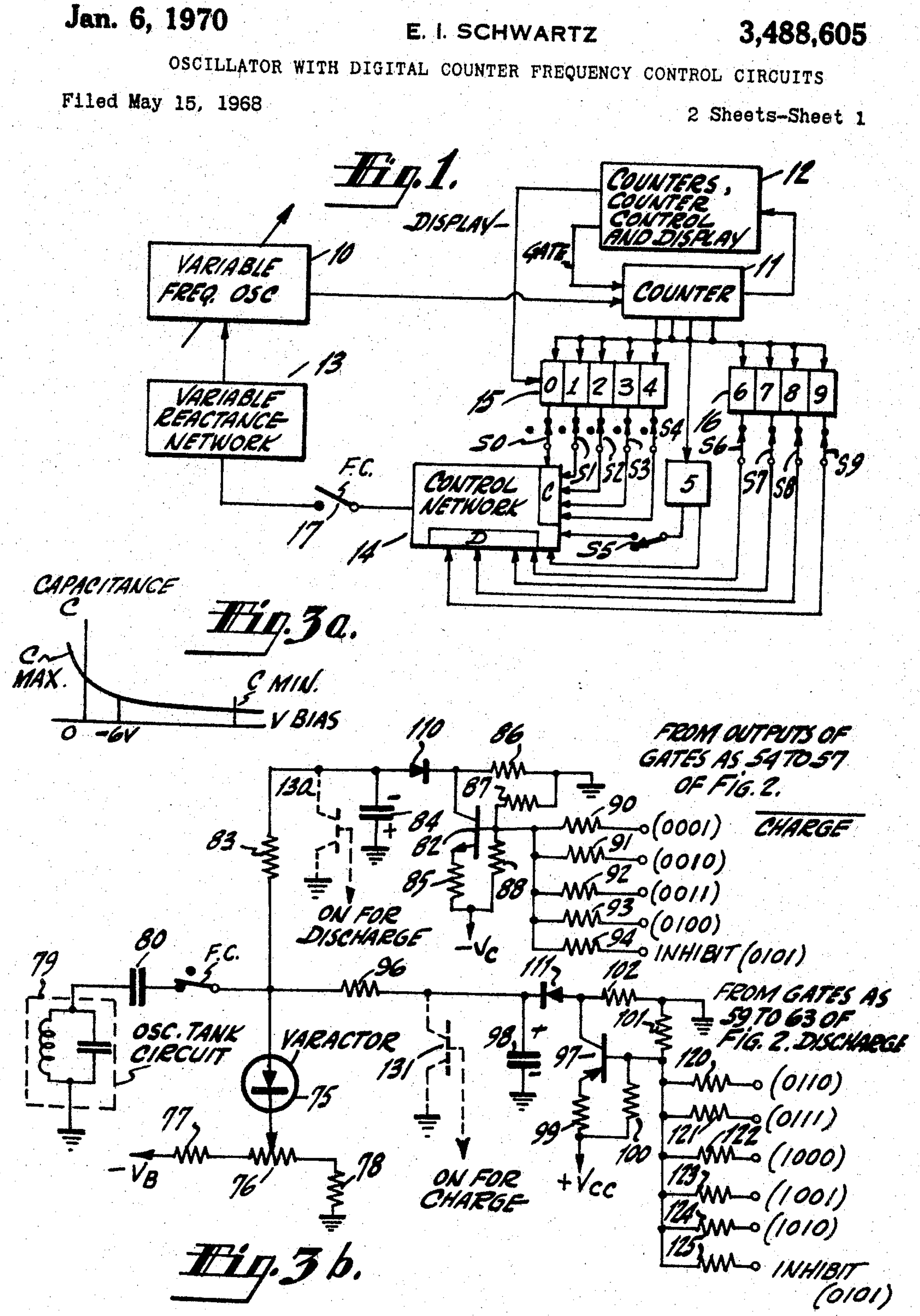
FIGURE 1 is a schematic diagram in block form of one embodiment of the present invention.
FIGURE 3*a* is a graph showing the capacitance versus voltage variation of a variable reactance device which could be employed with the present invention.
FIGURE 3*b* is a circuit diagram of a charge-discharge circuit which may be utilized in an embodiment of this invention.

The output frequency signal from the oscillator 10 is applied to the input of a counter 11 and further counters, control circuitry and a display device 12. The counters included in blocks 11 and 12 are of conventional design and serve to count the number of cycles representing the oscillator 10 frequency and provide, with proper decoding gates, and indicating devices, also included within rectangle 12, a visual or other presentation representing the frequency of the oscillator 10 to an operator, or for other means using the output therefrom.

For example oscillator 10, may be the local oscillator conventionally found in a radio receiver, television receiver, transmitter, test generator or any other type of equipment commonly employing a variable oscillator of one sort or another.

Specifically, counter 11 and those in rectangle 12, may be, binary devices utilizing feedback or other means to behave as decade counters or in fact may utilize a straight binary or other type of digital code. The counters are arranged in a configuration to provide utilization as a frequency meter. Such counters are shown, for example, in the text entitled, "Pulse and Digital Circuits," by Jacob Millman and Herbert Taub, McGraw-Hill Publishers (1956), in chapter eleven entitled, "Counting," pages 323 to 353. The above cited text shows on page 345, one way in which a chain of suitable counters may be utilized for the measurement of frequency.

The rectangle 12 includes a precision frequency source such as a crystal oscillator and suitable dividers to provide a clock used to gate the counter stages 11 and those in rectangle 12, to cause them to count a number of pulses over a predetermined interval. If this gating enabled the counters 11, 12 for precisely one second the counters would count frequency directly in cycles per second.

For present purposes counter 11, and those in rectangle 12, are assumed to be decade counters. Accordingly, shown coupled to the outputs of counter 11 are ten decode gates representing the ten states of such a counter. The states from zero to four (binary 0000 to 0100 are decoded by the five gates labeled 0, 1, 2, 3 and 4, respectively, and that portion of the decode network is generally referenced by numeral 15. Decode gate 5 is responsive to the state of binary 0101, or decimal five, while the decode gates 6 and 9, respectively, decode binary states 1010, 0111, 1000 and 1001. The counter 11 produces a pulse at the output lead coupled to the input of counters included in rectangle 12, for every ten pulses processed by counter 11. In this manner every decade counter in block 12, activates the next decade counter after it has received ten pulses. Therefore the stages count in a conventional decimal manner.

Each decode gate 0 to 9 is shown, by way of example, coupled through a switch, designated respectively as $S_0$ to $S_9$, to the input of a control network 14, whose output may be coupled to the input of a variable reactance network 13, through a switch 17 designated F.C., or frequency control. The switch 17 is shown opened but when in the dashed or closed position will couple the output terminal of the control network 14 to the input of the variable reactance network 13. The network 13 includes a variable reactance device as a varactor diode, a transistor reactance circuit, or some other suitable device whose capacitance or inductance can be varied as a function of or according to a suitable control signal applied thereto.

The variable reactance network 13, including the device has an output coupled to oscillator 10, and its reactance is coupled to form part of the frequency determining network inherently included in an oscillator 10. Such coupling, as known in the art, is provided in a manner to enable shifting or varying the frequency of oscillator 10 according to a particular value of the variable reactance device coupled thereto.

In describing the operation of the circuit of FIGURE 1 assume, for example, the frequency of the oscillator 10 is at 100, 100 Hz. or 100.1 kHz. and the counters 11 and those in rectangle 12 comprise six cascaded decade counters, which if gated by 1 Hz. signal generated from a precise source, such as crystal oscillator, included in rectangle 12, will read the frequency via proper decode gates directly in cycles per second. Therefore by using any type of convenient display, the input of which is controlled by the states of these counters 11 and 12, one would read 100, 100 pulses in one second or the six digit number 100, 100. Each digit of this number 100, 100 corresponds to an integer representing the actual oscillator 10 frequency. However, many such counters and frequency indicating means would not, for economical or other reasons, to be explained subsequently, require the presentation of all six decade counter outputs. In such instances the display may read 100.1 kHz. and therefore the last two digits or least significant would not be displayed.

One reason for this may be the stability of the variable oscillator 10 itself, as due to the range of frequencies that it may cover, its short or long term stability may not be that accurate, due to temperature changes, aging, supply variations and so on. Hence to generate 100, 100 cycles per second, the fifth and sixth digits, from the left, or the least significant, may change rather rapidly and the frequency obtainable could not be maintained as 100, 100 Hz. In such cases the actual frequency could actually be 100, 152 Hz. then moments later 100, 173 Hz. and so on. These numbers are by way of example only, and may even be more critical for higher frequency oscillations of oscillator 10, and so on. In any instance as above, depending on the intended application for the oscillator 10, the display of four decade stages indicating 100.1 kHz. could be adequate.

Furthermore because of the tuning range of oscillator 10, which may be band switched, as well, the counters as 11 and 12 could include further dividers and utilize prescaling or other similar techniques. In certain of such applications there would be no particular advantage in displaying more than four significant places. For examples of other suitable counting techniques, including prescaling, mixing and so on which might be used see the article entitled, "Digital U.H.F. Frequency Measurements," by William Badren in the November 1967 issue of Electronics World, pages 48 to 50.

However, in order to conveniently display the frequency of oscillator 10 without the need of accurately calibrated dials and so on, the counter circuits and displays as 11 and 12 are needed in certain applications to ease the calibration techniques associated with the tracking of an oscillator as 10.

Counter 11 as indicating the least significant digit would be included although its output may not be displayed directly.

The present invention takes advantage of this counter 11 and uses the outputs thereof to control the frequency of oscillator 10 to thereby obtain an extra degree of stability at a relatively minor additional cost.

For present purposes assume that the oscillator 10 is tuned to a frequency of 100, 187 Hz. and, for this example, the display reads and uses only 5 digits which would then be shown as 100.18 kHz. Now assume that the switch 17 labeled F.C. is closed. During the time in which the display is enabled, which might be for 1 second or less, counter 11 is inhibited from counting and has a count stored therein representative of the last or least significant digit of the oscillator 10 frequency. In the above case this number would correspond to seven as the sixth digit of 100, 187 is seven. This state activates decode gate 7, whose output is coupled through switch, $S_7$, to the D or discharge portion of the control network 14. The control network 14 produces a signal according to decode 7 which serves to provide at the output of the control network 14 a voltage level causing an increase in the reactance of the variable reactance device contained in rectangle 13. The increase in reactance appears across the oscillator 10 frequency determining network and causes the frequency to decrease. Assume, for example that for some reason the frequency decreased at the last digit below five and is now 100, 183 Hz.

The three state activates decode gate 3 of counter 11 and causes the control network 14 to provide a voltage at its output causing the variable reactance device 13 to decrease its magnitude, which in turn increases the frequency of variable oscillator 10.

As seen from FIGURE 1, the decode of the five state, does not change the control voltage as switch $S_5$ is opened. Therefore the control network retains its output which causes the oscillator 10 to provide the reading of five at the last digit thereof. In the manner shown the oscillator 10 will always seek the digit five or that digit corresponding to the opening of a suitable switch as $S_0$ to $S_9$. This can be seen from the fact that the control network 14 having its output coupled to the variable reactance device 13 always forces the oscillator 10 to raise or lower its frequency for any decode state other than that corresponding to the one or ones which affords no control of the frequency. This state is that represented by decode gate 5 in FIGURE 1. The control network 14 functions to store the level until the next display enable or at some other suitable sampling rate which can be under control of the normal counter control unit included within rectangle 12.

It can be seen that for different range variable reactance devices 13 and different control levels any one of the sixth digits, as determined by six decade counters, corresponding to the frequency can be used to control the frequency of the oscillator 10 forcing it to assume a state at that digit corresponding to the state isolated from the control network 14.

In this respect the user or operator of the equipment by closing switch 17 and selecting a state by operating a switch as $S_0$ to $S_9$, assures that the "unseen" or undisplayed state is known. In the case described above the action of the circuit would cause the oscillator 10 to produce a frequency whereby the last digit would be five. Therefore in the example given the reading would still be 100.18 kHz. but would be known as 100, 185 kHz.

Figure 2:
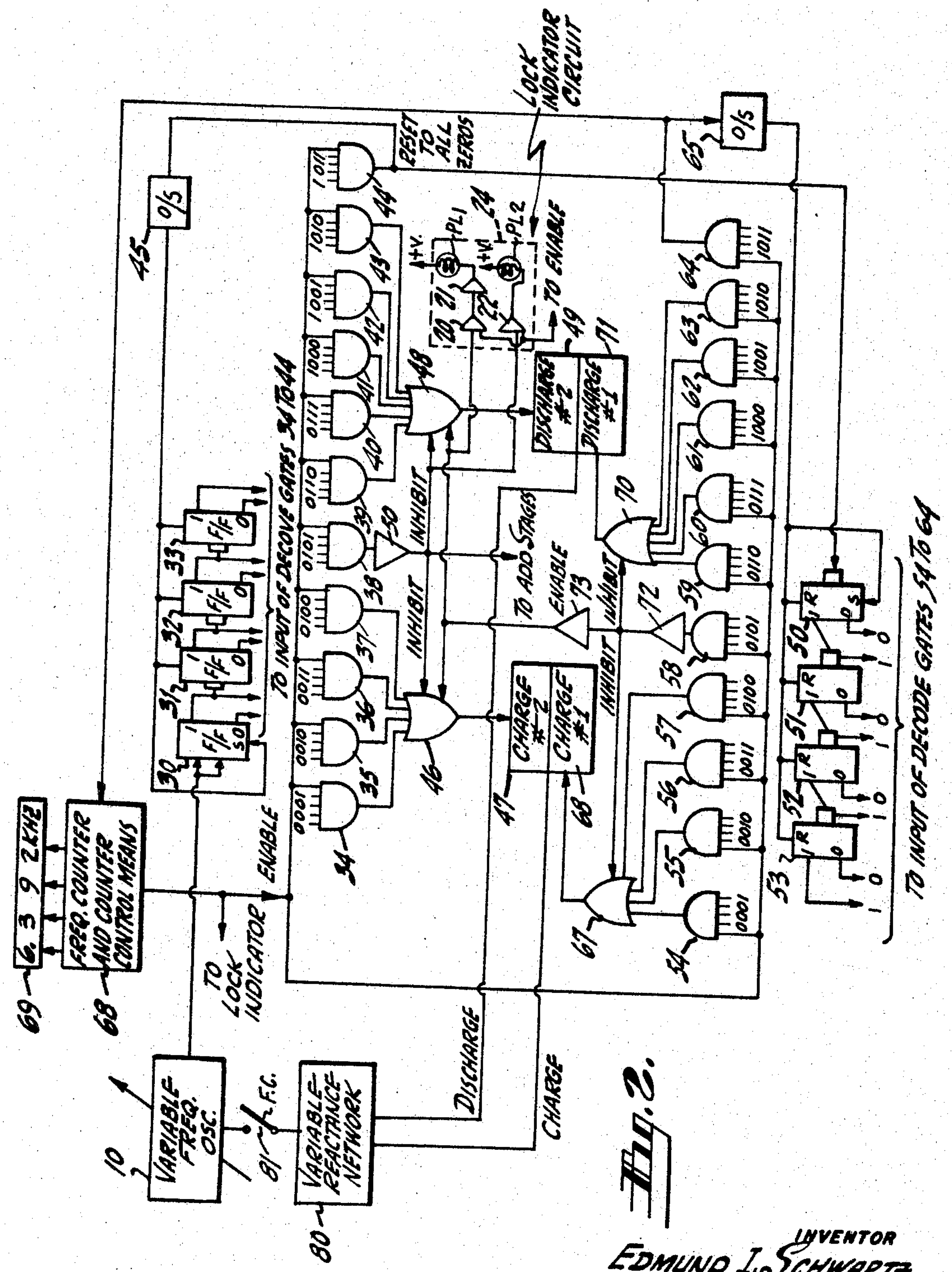
FIGURE 2 is a schematic diagram partly in block form of another embodiment of the present invention.

Referring to FIGURE 2 a system including the control technique shown in FIGURE 1 will be described in greater detail.

The variable frequency oscillator 10, is coupled to the input of a decade flip-flop (F/F) divider or counter, comprising the four flip-flops 30 to 33. For the sake of clarity the zero (0) and one (1) outputs of each flip-flop 30 to 33 are not connected to the decade gates 34 to 44. Such gates 34 to 44 are referred to as AND gates and serve to decode the ten states allowed in the binary counter comprising flip-flops (F/F's) 30 to 33. Feedback is accomplished by gate 44 decoding binary 1011 or decimal 11 and having its output coupled to a one shot or monostable multivibrator 45 which serves to reset the flip-flop counter back to the initlal or first state corresponding to 0001.

The decode gates 34 to 37 have their outputs coupled to the input or an OR gate 46 whose output is coupled to the input of a charge #2 circuit 47. The outputs of decode gates 39 to 43 are coupled to inputs of OR gate 48, whose output is coupled to the input of a discharge #2 circuit 49. A gate inverter 50, or a suitable inhibit circuit is coupled to inhibit inputs of OR gates 46 and 48. The input of gate 50 is coupled to the output of the decode 5 (0101) gate 38.

The output of the reset to zero gate 44 is also used as an input to a second binary decade counter comprising flip-flops 50 to 53. This second counter has decode gates 54 to 64, which serve to decode the ten permissible states available. The AND gate 64, triggers the one shot (O/S) 65 to reset flip-flops 50 to 53 back to their initial state after a count of ten; and its output is used as an input for four additional cascaded counters included in rectangle 68. Rectangle 68 also includes a gating generator and a source of precision frequency required, as described above, to perform frequency counting. Each decade counter stage, included in block 68, has decode gates as those described for the previous flip-flop counters and also has outputs coupled to a display module 69, which may include gas tubes, lights and so on, capable of giving a visual output corresponding to the state of the counters therein and representative of the frequency of oscillator 10.

Decode gates 54 to 57 have outputs coupled to the input of an OR gate 67, whose output is coupled to an input of an charge #1 circuits 68.

Decode gates 59 to 63 have their outputs coupled to the input of a OR gate 70, whose output is coupled to the input of a discharge #1 circuit 71.

The output of AND gate 58 is coupled to the input of an inverter 72 whose output is coupled to an inhibit input of OR gates 67 and 70.

The output of inverter 72 is also coupled to the input of inverter 73, having its output coupled to enable inputs or OR gates 46 and 48.

The charge #1 and 2 circuits 47 and 68 have their outputs coupled to a charge input of a variable reactance device network 80. The outputs of the discharge #1 and 2 circuits 49 and 71 are coupled to the discharge input of network 80.

The output of the variable reactance device network 80 is coupled to a terminal of the frequency control or F.C. switch 81 whose other terminal is coupled to the frequency determining network associated with variable frequency oscillator 10.

An enable output is coupled from the counter control means in rectangle 68 to the AND gates 34 to 44 and AND gates 54 to 64.

The operation of the circuit of FIGURE 2 is as follows:

Assume that the oscillator 10 is set at a frequency of 639, 287 Hz. and therefore, as shown, the four digit display 69 reads 6.392 kHz. Of course the counter comprising flip-flops 30–33 would at the display time, be at the count of seven, while that comprising flip-flops 50 to 53, is at the count of eight. However, the operator only knows what the first four digits are, namely, those he can view as 6.392 kHz. The operator now closes switch 81 coupling the variable reactance device network 80 to the input of the frequency determining network of the oscillator 10.

The following events occur at a suitable enable pulse time: all decode gates 54 to 64 associated with flip-flops 50 to 53 are enabled. The state of the flip-flops 50 to 53 representing the fifth digit of the frequency of the oscillator 10, which as above, is the number eight. This state of eight corresponds to activating gate 61, or the binary (1000) AND gate, and this is the only gate having a logic output different from all the other gates 54, 55, 56 and so on. The output of gate 61 activates OR gate 70 to control the discharge circuit 71. Circuit 71 provides a control level at its output, according to the decode gate 61 output, which is coupled to the variable reactance device network 80, serving to increase its reactance aod therefore lower the frequency of the oscillator 10. Assume that the control causes the oscillator to shift from 639, 287 Hz. to 639, 267 Hz. At the next sample or enable pulse, gate 59 or binary (0110) is activated and again the frequency of oscillator 10 is shifted downward; this gate 59 couples to the discharge circuit 71 via OR gate 70 in the same manner as the output of gate 61. As soon as the oscillator frequency reads 639, 257 Hz., gate 58 or binary (0101) is enabled. This gate 58 does not control the discharge circuit 71, but its output serves to inhibit OR gate 70 via inverter 72, to cause the discharge circuit 71 to maintain that level to the variable reactance device 80 which corresponds to the digit five appearing at the fifth integer as in 639, 257 Hz. At this desired point, OR gates 46 and 48 are enabled due to the enabling of gate 58 via inverters 72 and 73. The counter comprising flip-flops 30 to 33 is in the state corresponding, for the example as above, to seven, as the frequency of oscillator 10 is more 639, 257 Hz. This corresponds to the gate 40 being enabled, which in turn activates OR gate 48, to control discharge. #2 circuit 49 to again lower the frequency of oscillator 10, by a second suitable potential imposed on variable reactance device included in rectangle 80. In this manner the least significant or sixth digit is caused to assume a state corresponding to decimal five and the final frequency that oscillator 10, settles to is 639, 255 Hz.

Therefore, once the operator, throws switch 81, and connects the reactance device to the oscillator 10 he knows what the last two digits are; even though the display inindicates only the four most significant.

If for example, initially the oscillator was set at a frequency of 639, 227 Hz., then decode gate 55 would be activated as flip-flops 50 to 53 would read the state corresponding to the fifth digit of the frequency 639, 227 Hz. or two. This would cause OR gate 67 to activate and control charge #1 circuit 68 to raise the frequency of the oscillator 10, by applying a suitable voltage or signal to the variable reactance device within rectangle 80. The increase in frequency of the oscillator 10 would cause the counters to again read five in the fifth place and the next circuit comprising decode gate 34 to flip-flop counters 30 to 33 and so on could then again be enabled and serve to charge the oscillator frequency to 639, 255 Hz.

The technique described above may be implemented in other ways as by using different codes and different control configurations wtthout departing from the spirit of this invention. For example one need not utilize all decode gates, as shown, as all one has to know is whether he is above or below the desired state of five for that particular integer place representing the oscillator 10 frequency.

Also shown in FIGURE 2 is a lock indicator circuit. The lock indicator circuit included within the dotted rectangle 24 functions as follows. The input of an inverter or lamp driver 20 is coupled to the output of the inverter 73, which enables inverter 20 when the counter comprising flip-flops 53 to 50 is reading 0101 or five. This in turn causes inverter 21 to cease activation of pilot lamp PL1. The inverter 20 is sampled at the same time the display is activated, as described above, by means of the enable pulse from the counter control means included in block 68. This PL1 which in a front panel display will light if the oscillator 10 does not provide a frequency which corresponds to the number five appearing in the above counter. The lamp driver 22 coupled to inverter 50, performs the same functions for the counters comprising flip-flops 30 to 33. Accordingly the operator can view the two pilot lamps PL1 and PL2 and know whether or not the oscillator is locked. If the frequency, as above, is at 639, 255 Hz., both lamps as PL1 and PL2 are off. For any other value, except five, appearing in the fifth and sixth places, either or both lamps go on indicating the system is "out of lock."

It should be apparent that due to the nature of the servo control shown herein, the oscillator 10 necessarily will seek the isolated state selected by the design requirements. It can also be seen that any one of the decode gates can be so isolated and therefore the circuit will serve to settle the oscillator 10 at a frequency corresponding to that state so isolated. The above technique can, of course, be extended to control each of the digits as the first, second, third, fourth and so on, by coupling the counters in a manner similar to that shown in FIGURE 2.

In this way a frequency synthesizer could be provided or an local oscillator for a sideband, F.M. or television receiver.

The technique could be employed to lock a single fixed frequency oscillator as well, where the stability of the same is accurate only to a limited number of significant places.

Referring to FIGURE 3 there is shown a circuit which could be utilized for a discharge-charge circuit shown in FIGURE 2 as 47 and 49, or for that shown in FIGURE 2 as 68 and 71 for different voltage levels and operating conditions, as will be explained subsequently.

FIGURE 3*a* shows a typical graph of capacitance versus voltage for a variable reactance diode sometimes referred to as a varactor diode. It can be seen that the capacitance across the junction of the device or that capacitance across its terminals increases with increasing forward bias and decreases with increasing reverse bias.

The varactor 75 of FIGURE 3*b* exhibits such a characteristic. The cathode of varactor 75 is coupled to a variable arm of a potentiometer 76 included as part of a voltage divider between $-V_B$ and ground. The divider comprising potentiometer 76 in series with resistors 77 and 78. The anode of diode 75 is coupled through the F.C. switch, or a frequency control switch as 81 of FIGURE 2, through a capacitor 80 to a tank circuit 79, which may be, for example, the frequency determining network of an oscillator such as 10 of FIGURE 1 or 2.

The anode of varactor diode 75 is coupled to the collector electrode of an NPN transistor 82, through the series resistor 83 and diode 110. The junction formed between the collector electrode of transistor 82 and resistor 83 is returned to ground through a charge control capacitor 84. The emitter electrode of transistor 82 is returned to a $-V_C$ supply through a current limiting resistor 85. The collector electrode of transistor 82 is returned to a point of reference potential, such as ground, through load resistor 86. A bias network comprising resistors 87 and 88 is coupled between the $-V_C$ source and ground, and connected to the base electrode of transistor 82.

The base electrode of transistor 82 is also coupled to resistors 90 to 94, at a common terminal of each. The other terminals of the above resistors are returned to an output of an associated decode gate, from a decade counter, as gates 54 to 57 of FIGURE 2.

In a similar manner the anode of varactor 75 is coupled through resistor 96 and a diode 111 to the collector of a PNP transistor 97. A charge controlled capacitor 98 returns the junction between the cathode electrode of diode 111 and resistor 96 to a point of reference potential as ground.

The emitter electrode of transistor 97 is coupled to a $+V_{CC}$ source through resistor 99. Bias is obtained from the base network comprising, in part resistors 100 and 101, while the collector electrode of transistor 97 is returned to ground through resistor 102. Base control current for transistor 97 is further obtained from resistors 120 to 125. These resistors 120 to 125 have a common terminal connected to the base electrode of transistor 97 and an individual terminal coupled to an associated counter decode gate, as gates 59 to 63 of FIGURE 2. Resistors 94 and 125 are both coupled to the isolated gate (as 58 of FIGURE 2) through a suitable inverter and so on, which inputs to these resistors will serve to inhibit or cutoff both transistors 82 and 97.

Shown connected across capacitors 84 and 98 are transistors 130 and 131, drawn in a dashed line, the functions of which will be described subsequently.

Assume, initially, that the counter comprising flip-flops 50 to 53 of FIGURE 2 are interrogated and that the present state of the counter is binary 0010 which refers to the digit 2 present in the counter. It is realized that the representation of a digit or a binary number by the display can be made to correspond to the exact frequency count by any number of means available to logic designers and known in the art.

In this case resistor 91 coupled between the base electrode of transistor 82 and the output of gate 55 of FIGURE 2, corresponding to the decode of 0010 is subjected to a voltage and supplies a predetermined amount of base current to transistor 82. Transistor 82, acts as a variable impedance between its collector and emitter electrodes and causes current to flow therethrough determined by the base current supplied via resistor 91. This causes a determined negative potential to appear at the collector electrode of transistor 82 and causes capacitor 84 to charge according to this potential. The charge across capacitor 84 causes a negative potential to appear via isolating resistor 83 at the anode of varactor 75. This, as seen from FIGURE 3*a*, lowers the capacitance of the varactor, and as diode 75 is in shunt with the oscillator tank 79, raises the oscillator frequency. The increase in frequency may cause the new number four to appear in the counter comprising flip-flops 50 to 53. This now causes resistor 93 to supply a different amount of base current and hence the collector of transistor 82 goes more negative further raising the frequency of the oscillator.

When gate 58 of FIGURE 2 is enabled corresponding to the digit five or the 0101 state of the counter the transistor 82 is cut off, the voltage across capacitor 84 is stored until the next sample time due to the time constants of the circuits. Diode 110 prevents discharge of capacitor 84 through resistor 86 or transistor 81 for the required time. In this manner the oscillator is maintained at this frequency indicating five at the required integer.

If, for example, the counter of FIGURE 2, read eight corresponding to activating gate 61 of FIGURE 2, resistor 122 would supply base current to transistor 97, whose collector would charge capacitor 98 positive, thus increasing the forward bias across varactor 75, and therefore decreasing the oscillator's frequency, because of the increase in capacitance. This action again forces the oscillator to provide the frequency corresponding to the count or binary (0101) or five. When five is reached the circuits are inhibited and therefore the charge presently controlling the varactor 75 is maintained for a desired interval, depending upon the time constants selected, as determined by the frequency range of the oscillator and the enabling time of the counter circuitry associated therewith.

The NPN transistor 130, could serve to shunt or discharge capacitor 84, when the transistor 97 is controlling the varactor, as transistor 131 serves to discharge capacitor 98 when transistor 82 is controlling. The base of transistor 130, for example, could be returned to the output of the OR gate 70, indicating the discharge #1 mode of FIGURE 2. While the base of transistor 131 could be coupled to and biased on by the output of OR gate 67 of FIGURE 2 indicating a charge mode.

FIGURE 3, is included by way of example, and other control techniques such as pulse width modulation, pulse amplitude modulation and so on could be used to control the charge and discharge of varactor devices and hence raise or lower their effective capacitance. One can vary the frequency of an astable or free running multi according to the detected state, integrate the pulses to obtain a vary D.C. level according to the repetition rate and in this manner perform control.

From the foregoing it is seen that the applicant has provided a frequency control system which may tune an oscillator according to an isolated state of a counter included in a chain of such counters. The system has particular utility in the test equipment field, as in generators, synthesizers and so on, but has uses in the communications field as in local oscillator design, etc. Three specific figures including two block diagrams of different embodiments have been shown and described, but it will be evident that the invention is not limited to the specific examples shown herein but that the novel concept and underlying principle of this invention is susceptible of numerous variations and modifications.

The specification and drawing are therefore to be regarded as illustrative rather than in a limiting sense.

I claim:

1. Frequency control apparatus for stabilizing the frequency of a variable oscillator to a predetermined value, comprising:

(a) a counting circuit coupled to said oscillator for converting the frequency of a signal output therefrom into a numerical code, (b) decoding means coupled to said counting circuit to translate any numerical code therefrom less said code representative of said predetermined value into a plurality of distinct output levels, (c) a variable reactance device, (d) means coupled between said variable reactance device and said decoding means, to vary said oscillator's frequency in a direction according to said distinct output levels to correspond to said predetermined value.

2. Apparatus for controlling the frequency of an oscillator by controlling the numerical value of said frequency at any preselected digit representing a portion of the total numerical value, comprising:

(a) a counting circuit coupled to said oscillator for converting the frequency of a signal output therefrom into a numerical code, (b) decoding means coupled to said counting circuit to translate said numerical code into any one of a plurality of integers corresponding to said preselected digit representing a portion of the total numerical value of said frequency, (c) a variable reactance device coupled to said oscillator for controlling the frequency thereof, (d) control coupled to said decoding means ressponsive to all but one of said integers to provide a control signal of a magnitude proportional to said integers, (e) means coupling said variable reactance device to said control means for varying said reactance in response to said control signal causing said frequency of said oscillator to correspond to said but one of said integers at said preselected digit.

3. Frequency control apparatus for a variable oscillator capable of being tuned over a given range of frequencies represented by a series of numbers having a selected number of digits, comprising:

(a) a counting circuit coupled to said oscillator for converting the frequency of a signal output therefrom to a numerical code, (b) decoding means coupled to said counting circuit to translate said numerical code into one of a plurality of distinct integers corresponding to at least one digit of said frequency, (c) a variable reactance device coupled to said oscillator for controlling the frequency thereof, (d) means coupled between said variable reactance device and said decoding means responsive to the translation of all but one of said distinct integers for varying the reactance of said device and therefore the frequency of said oscillator to correspond with said but one of said distinct integers at said one digit corresponding to said frequency.

4. Apparatus for controlling the frequency of a variable oscillator to correspond to a predetermined frequency comprising:

(a) a number of cascaded decade counters coupled to said oscillator and controlled to provide a direct decimal indication of said frequency, (b) translating means coupled to a selected one of said cascaded decade counters for decoding all but one of said decade states available to said selected counter, (c) control means coupled between said translating means and said variable oscillator for varying the frequency of said oscillator in a direction according to said decoded states to cause said selected decade counter to indicate said decode states corresponding to said but one state.

5. The apparatus according to claim 4 wherein said control means includes a varactor diode coupled to said oscillator for varying the frequency thereof.

6. The apparatus according to claim 5 wherein each decade counter, comprises four bistable multivibrators arranged in a counting configuration and possessing a feedback network to permit said counter to indicate only ten states.

7. In combination:

(a) an oscillator capable of generating a signal at any one of a wide range of frequencies at an output thereof, (b) a counter coupled to said oscillator and responsive to said signal for providing a digital code representative of the frequency of said oscillator, (c) a plurality of gates coupled to said counter for decoding any digital code therein, representative of said frequency of said oscillator, (d) a variable reactance device coupled to said oscillator for varying the frequency thereof in response to a suitable control signal, (e) means coupled between said plurality of gates, less one, and said variable reactance device to provide a control voltage for said variable reactance device to vary the frequency of said oscillator in a direction to correspond to that frequency decoded by said less one gate.

8. Apparatus for stabilizing the frequency of an oscillator by monitoring at least one significant digit of a decimal number display or indicating means representative of the frequency of said oscillator, comprising:

(a) a counting circuit coupled to said oscillator for translating the frequency thereof into a digital code, where each digit of said decimal number is represented by said digital code, (b) translating means coupled to that portion of said counting circuit representative of one least significant digit of said decimal number for decoding all of said digital codes representing said digit except one selected one, (c) a variable reactance device coupled to said oscillator for controlling the frequency thereof, (d) means coupled between said variable reactance device and said translating means to vary the frequency of said oscillator according to said decoded codes in a direction towards a frequency corresponding to said least significant digit being that represented by said one selected code.

9. The apparatus according to claim 8 wherein said digital code is the binary code.

10. Apparatus for generating a relatively stable output frequency, comprising:

(a) a variable oscillator capable of providing any one of a wide range of frequencies at an output thereof, (b) a counter coupled to said output of said oscillator for translating any one of said frequencies into a digital code representative of a given number of integers corresponding to said frequency, (c) decoding means coupled to a portion of said counter for decoding one of said digital codes representing a selected integer, including a plurality of gates one for each permissible state of said digital code, (d) a variable reactance device coupled to said oscillator for varying the frequency thereof in a higher direction for a first control signal range and in a lower direction for a second control signal range, (e) first means coupled between a first set of said plurality of gates and said variable reactance device for providing a control signal over said first range, (f) second means coupled between a second different set of gates and said variable reactance device to provide a control signal over said second range, (g) an inhibiting circuit having an output coupled to said first and second means and an input coupled to one selected gate of said plurality, not included in said first or second sets, for disabling said first and second means when said one selected gate is activated by said permissible state associated therewith being present in said counter, whereby the frequency of said oscillator at said selected integer is at that frequency corresponding to the digital code associated with said selected gate at that integer.

11. The apparatus according to claim 10 wherein said counter comprises, a number of cascaded decade counters, each capable of counting ten events represented by ten states each of which is defined by a combination of four binary bits, said number of counters equal to the number of digits representing a specified decimal number sufficient to indicate the frequency of an oscillator.

12. The apparatus according to claim 11 wherein said decoding means comprises at least ten AND gates each having four inputs, to decode each of ten states represented by said four binary bits.

13. The apparatus according to claim 10 wherein said variable reactance device is a varactor diode.

14. The apparatus according to claim 12 wherein said first set of gates coupled to said first means are those AND gates for decoding the first four lower magnitude binary states, said second different set of gates coupled to said second means are those AND gates for decoding the higher states from the sixth to the tenth state, whereby said one selected gate coupled to said inhibiting circuit input is an AND gate for decoding the fifth binary state.

15. The apparatus according to claim 10 wherein each of said plurality of gates included in said decoding means is coupled to an individual switch for selectively removing any desired one of said gates from said first or second sets coupled to said first and second means and connecting it to said inhibiting means, whereby said selected one coupled to said inhibiting means can be any desired gate.

References Cited

UNITED STATES PATENTS

| | | | |
|---|---|---|---|
| 3,217,267 | 11/1965 | Loposer | 331—18 X |
| 3,349,338 | 10/1967 | Sosin | 331—18 |

ALFRED L. BRODY, Primary Examiner

S. H. GRIMM, Assistant Examiner

U.S. Cl. X.R.

331—1, 18, 36, 175